(12) United States Patent
Inoue et al.

(10) Patent No.: US 7,910,053 B2
(45) Date of Patent: Mar. 22, 2011

(54) SEMICONDUCTOR DEVICE AND ACTIVE MATRIX DISPLAY DEVICE

(75) Inventors: Kazunori Inoue, Tokyo (JP); Nobuaki Ishiga, Kumamoto (JP); Kensuke Nagayama, Kumamoto (JP); Kazumasa Kawase, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 26 days.

(21) Appl. No.: 11/741,193

(22) Filed: Apr. 27, 2007

(65) Prior Publication Data

US 2007/0284742 A1    Dec. 13, 2007

(30) Foreign Application Priority Data

May 26, 2006   (JP) .................................. 2006-146724

(51) Int. Cl.
 *H01L 23/48* (2006.01)
(52) U.S. Cl. . 420/550; 257/213; 257/288; 257/E51.005; 257/E21.006
(58) Field of Classification Search .................. 257/202, 257/749, 750, 771, 711; 349/56, 148, 139; 252/521.2, 521.1; 420/550
See application file for complete search history.

(56) References Cited

U.S. PATENT DOCUMENTS

| | | | |
|---|---|---|---|
| 5,318,641 A * | 6/1994 | Masumoto et al. | 148/403 |
| 5,367,179 A * | 11/1994 | Mori et al. | 257/59 |
| 6,016,174 A | 1/2000 | Endo et al. | |
| 6,252,247 B1 | 6/2001 | Sakata et al. | |
| 6,297,519 B1 | 10/2001 | Fujikawa et al. | |
| 6,372,054 B1 * | 4/2002 | Kikuchi et al. | 148/98 |
| 6,468,822 B2 | 10/2002 | Maeda et al. | |
| 6,509,215 B2 | 1/2003 | Fujikawa et al. | |
| 6,533,965 B1 | 3/2003 | Sasaki et al. | |
| 6,534,349 B1 | 3/2003 | Kubota et al. | |
| 6,794,759 B2 | 9/2004 | Kubota et al. | |
| 6,897,479 B2 | 5/2005 | Fujikawa et al. | |
| 7,012,338 B2 | 3/2006 | Kubota et al. | |
| 7,034,335 B2 | 4/2006 | Fujikawa et al. | |
| 7,098,539 B2 | 8/2006 | Gotoh et al. | |
| 7,154,180 B2 | 12/2006 | Gotoh et al. | |
| 2002/0086453 A1 | 7/2002 | Kim et al. | |
| 2002/0180898 A1 * | 12/2002 | Yoo et al. | 349/43 |
| 2004/0022664 A1 * | 2/2004 | Kubota et al. | 420/550 |
| 2004/0109101 A1 | 6/2004 | Kim et al. | |

(Continued)

FOREIGN PATENT DOCUMENTS

CN        1504819 A        6/2004

(Continued)

OTHER PUBLICATIONS

Office Action issued Oct. 5, 2010, in JP Patent Application No. 2006-146724 with English Language Translation.

*Primary Examiner* — Leonardo Andújar
*Assistant Examiner* — William Harriston
(74) *Attorney, Agent, or Firm* — Oblon, Spivak, McClelland, Maier & Neustadt, L.L.P.

(57) ABSTRACT

A semiconductor device includes a semiconductor layer, an Al alloy film electrically connected to the semiconductor layer, and a transparent electrode layer directly contacting with the Al alloy film at least over an insulating substrate. The Al alloy film includes one or more kinds of elements selected from Fe, Co and Ni in total of 0.5 to 10 mol %, and a remaining substantially comprises Al.

19 Claims, 10 Drawing Sheets

U.S. PATENT DOCUMENTS

| | | | |
|---|---|---|---|
| 2004/0124417 A1* | 7/2004 | So et al. | 257/72 |
| 2005/0258426 A1* | 11/2005 | Shin | 257/72 |
| 2006/0097649 A1* | 5/2006 | Kim et al. | 315/169.4 |
| 2006/0192481 A1 | 8/2006 | Nagayama et al. | |
| 2006/0237849 A1 | 10/2006 | Gotoh et al. | |

FOREIGN PATENT DOCUMENTS

| | | |
|---|---|---|
| JP | 3-129326 | 6/1991 |
| JP | 7-45555 | 2/1995 |
| JP | 10-268353 | 10/1998 |
| JP | 11-284195 | 10/1999 |
| JP | 11-337976 | 12/1999 |
| JP | 2000-77666 | 3/2000 |
| JP | 2001-155549 | 6/2001 |
| JP | 2001-174848 | 6/2001 |
| JP | 2001-281698 | 10/2001 |
| JP | 2002-268091 | 9/2002 |
| JP | 2003-089864 A | 3/2003 |
| JP | 2003-234193 | 8/2003 |
| JP | 2003-273109 | 9/2003 |
| JP | 2004-103695 A | 4/2004 |
| JP | 2004-214606 | 7/2004 |
| JP | 2004-260194 A | 9/2004 |
| JP | 2004-363556 | 12/2004 |
| JP | 2005-121908 | 5/2005 |
| JP | 2005-191326 | 7/2005 |
| JP | 2005-317579 | 11/2005 |
| JP | 2006-100856 | 4/2006 |
| JP | 2006-126255 | 5/2006 |
| JP | 2006-236839 | 9/2006 |
| JP | 2008-124499 | 5/2008 |
| KR | 2002-0089982 | 11/2002 |
| KR | 10-2006-0040861 | 5/2006 |
| WO | 2005/093505 | 6/2005 |

* cited by examiner

SEMICONDUCTOR DEVICE AND ACTIVE MATRIX DISPLAY DEVICE

BACKGROUND OF THE INVENTION

1. Field of the Invention

The present invention relates to a semiconductor device, and particularly to a semiconductor device used for an active matrix display device.

2. Description of Related Art

In recent years in the field of display device for displaying images, among the semiconductor device, flat panel display devices are rapidly becoming common such as a liquid crystal and an Electro Luminescence (EL) display device that are identified by energy-saving and occupying a small space. In these display devices, several electrodes, lines and devices are provided. Specifically, scanning and signal lines and switching devices such as a Thin Film Transistor (TFT) having a gate and a source/drain electrode are provided in arrays. The TFT array substrate of an active matrix type to control each pixel individually is widely used.

An active matrix TFT array substrate used for a liquid crystal display device that uses liquid crystals as electro-optic devices is disclosed in Japanese Unexamined Patent Application Publication No. 10-268353. In such active matrix TFT array substrate, there are one or more kinds of metal films provided and also a transparent electrode layer including ITO, IZO or the like provided in an input/output terminal portion of pixel electrodes and video signals. In general, there are a plurality of connectors provided in which the metal films and the transparent electrode layers are electrically connected.

Further, to prevent signals delays caused by longer scanning and signal lines and smaller line width thereof associated with a larger and highly-defined (increased number of display pixels) liquid crystal display, materials of electrodes and lines are desired to have low resistance electrically as Al. However if using Al for metal films, a favorable electric contact characteristic with a transparent electrode layer including ITO, IZO or the like cannot be obtained. Therefore as disclosed in Japanese Unexamined Patent Application Publication No. 3-129326 and Japanese Unexamined Patent Application Publication No. 2000-77666, generally a method has been used in which a high-melting point metal film such as Ti, Cr and Mo is formed in the connectors between the metal and transparent electrode films to obtain a favorable electric contact characteristic between Al and the transparent electrode layer through the high-melting point metal film.

However it has now been discovered that as in Japanese Unexamined Patent Application Publication No. 3-129326 and Japanese Unexamined Patent Application Publication No. 2000-77666, if Al and the high-melting point metal are laminated, there has been a problem that a process is required to form the high-melting point metal film. Further, depending on the kind of the high-melting point metal layer, an edge part of the laminated layer line pattern could be an inverse taper shape due to a difference in corrosion potentials in etchant in a etching process for patterning, and thus it has been a problem that a coverage failure is generated in a film formed in a upper layer.

SUMMARY OF THE INVENTION

The present invention has been made with the aim of solving above problem and providing a semiconductor device that is able to directly contact an electrode and line formed from a metal film mainly including Al with a transparent electrode layer without involving a high-melting point metal layer.

According to an aspect of the present invention, there is provided a semiconductor device includes a semiconductor layer, an Al alloy film electrically connected to the semiconductor layer, and a transparent electrode layer directly contacting with the Al alloy film at least over an insulating substrate. The Al alloy film includes one or more kinds of elements selected from Fe, Co and Ni in total of 0.5 to 10 mol %, and a remaining substantially comprises Al.

The present invention provides a semiconductor device that is able to directly contact an electrode and a line that are formed by metal films mainly including Al with a transparent electrode layer without involving a high-melting point metal film.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

The main reason that a favorable contact characteristic cannot be obtained in electric connectors between a conventional Al and ITO or IZO film is thought to be because of Al oxide ($AlO_x$) having electric insulating properties over an interface of both films (for example see "Evaluation of ITO/AlN Interface Reflection Layer by XPS", Extended Abstracts of the 47th Meeting of the Japan Society of Applied Physics (held in March 2003 at Aoyama Gakuin University), 31a-YA-9, pp 866, 2000). The inventors tentatively formed a metal Al film of approximately 200 nm thickness and an ITO film of approximately 100 nm thickness by a sputtering technique and closely examined around its interfaces using the Auger electron spectroscopy analysis method, X-ray photoelectron spectroscopy, and transmission electron microscope. As a result, Al oxide ($AlO_x$) of approximately 5 to 10 nm thickness is formed as a uniform layer and the inventors confirmed that this disturbs an electric conductivity. These phenomena occur when forming an IZO film instead of the ITO film.

As a result of dedicated research, the inventors found out that a favorable electric contact characteristic is obtained by adding an appropriate element to Al.

An example of an embodiment that a semiconductor device of the present invention is applied to a TFT active matrix substrate used for a liquid crystal display is described hereinafter. However the present invention is not limited to the following embodiment. Further, the description and the drawings are in the generalized and simplified form as appropriate in the interest of clarity and conciseness.

First Embodiment

Figure 1:
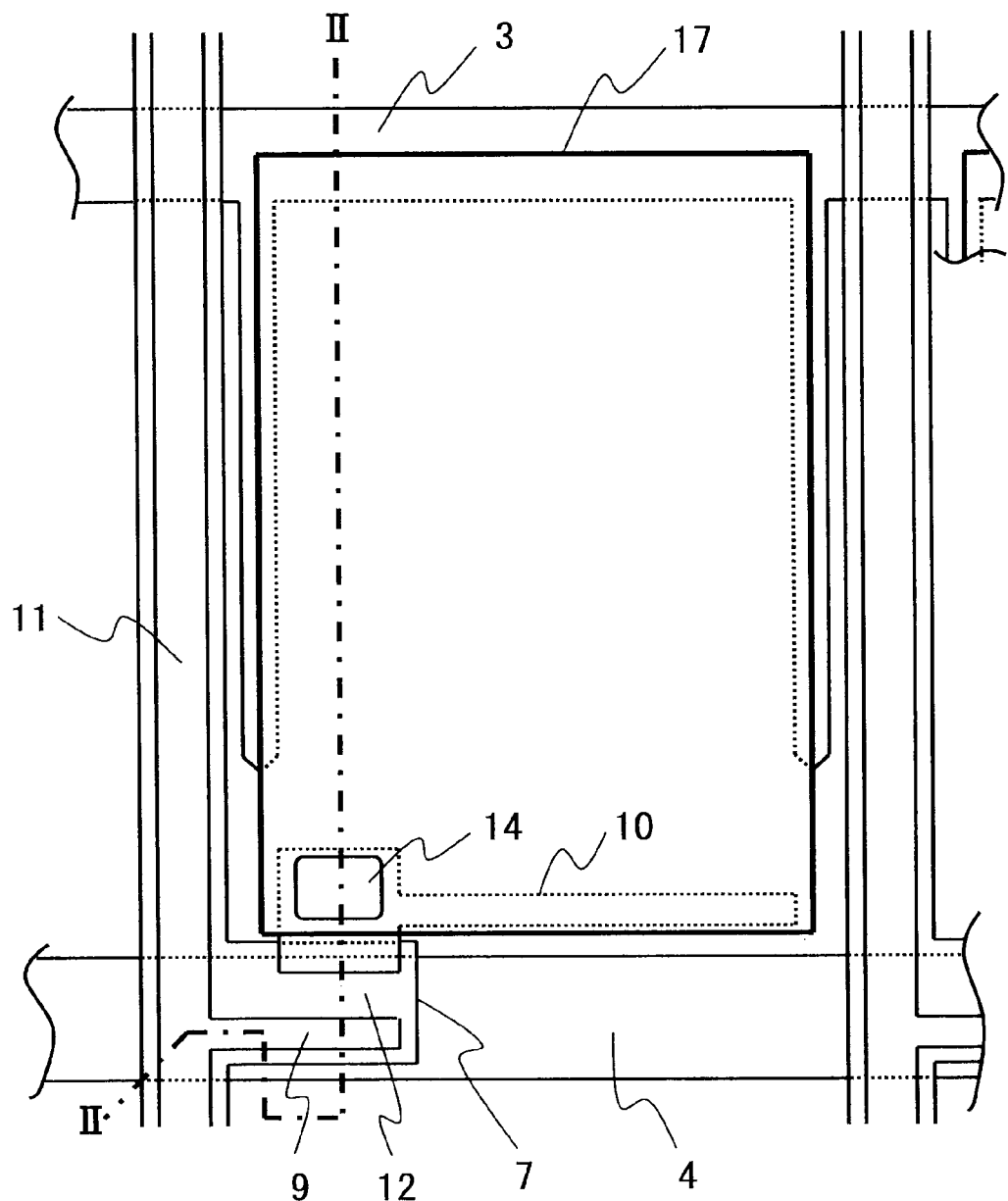
FIG. 1 is a plan view showing a TFT active matrix substrate according to a first embodiment of the present invention.
Figure 2:
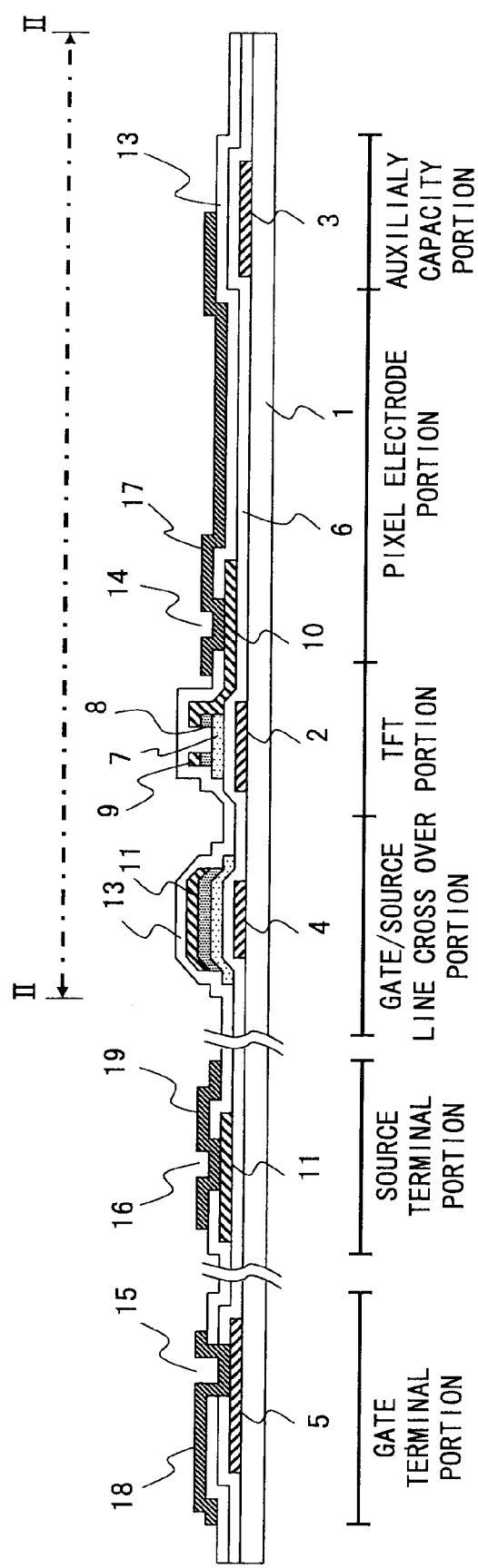
FIG. 2 is a cross-sectional diagram showing a TFT active matrix substrate according to the first embodiment of the present invention.

FIG. 1 is a plan view showing a pixel of an image display region in a TFT active matrix substrate of a first embodiment. FIG. 2 is a cross-sectional diagram taken along the line II-II of FIG. 1 and also a cross-sectional diagram showing a signal input terminal portion formed outside an image display region (not shown in FIG. 1) of a TFT active matrix substrate. As the signal input terminal portion, a gate terminal that a scan signal is input therein and a source terminal that a video signal is input therein are shown.

The TFT active matrix substrate shown in FIGS. 1 and 2 includes a transparent insulating substrate 1, a gate electrode 2, an auxiliary capacity common electrode 3, a gate line 4, a gate terminal 5, a gate insulating film 6, a semiconductor active film 7, an ohmic contact film 8, a source electrode 9, a drain electrode 10, a source line 11, a TFT channel portion 12, an interlayer dielectric 13, a pixel drain contact hole 14, a gate terminal contact hole 15, a source terminal contact hole 16, a pixel electrode 17, a gate terminal pad 18 and a source terminal pad 19.

For the transparent insulating substrate 1, a transparent insulating substrate such as a glass substrate and fused quartz may be used. The thickness of the insulating substrate 1 may be any thickness but preferably less than or equal to 1.1 mm so that the thickness of the liquid crystal display becomes thinner. If the insulating substrate 1 too thin, the substrate is distorted due to various film forming and a thermal history of processes thereby generating defects such as a decreasing patterning accuracy. Thus the thickness of the insulating substrate 1 needs to be selected in consideration over the process to be used. Further, if the insulating substrate 1 is made up of brittle fracture material such as a glass, edge face of the substrate is preferably chamfered in light of preventing any foreign matters from getting inside by a chipping from the edge face. Further, it is preferable that a notch is created at a part of the transparent insulating substrate 1 so as to identify the orientation of the substrate for easier process management because the orientation of the substrate process in each process can be identified.

The gate electrode 2, auxiliary capacity electrode 3, gate line 4, and gate terminal 5 are formed over the transparent insulating substrate 1. The gate electrode 2, auxiliary capacity electrode 3, gate line 4 and gate terminal 5 are formed by the same metal film. As the metal film, Al alloy of approximately 100 to 500 nm thickness may be used.

The gate insulating film 6 is formed over the transparent insulating substrate 1, gate electrode 2, auxiliary capacity electrode 3, gate line 4 and gate terminal 5. As the gate insulating film 6, a silicon nitride film ($SiN_x$), a silicon oxide film ($SiO_x$), a silicon nitric-oxide film ($SiO_xN_y$) or a laminated film of them may be used. The thickness of the gate insulating film 6 is approximately 300 to 600 nm. If the film is thin, it is likely to generate a short-circuit in a crossover of gate lines 4 and source lines 11. Therefore, the film preferably has a thickness of more than the gate line 4, auxiliary capacity electrode 3 or the like. On the other hand, if the film thickness is thick, an ON current of TFT decreases and a display properties decrease.

The semiconductor active film 7 is formed over the gate insulating film 6. For the semiconductor active film 7, an amorphous silicon (a-Si) film or a polycrystalline silicon (p-Si) film of approximately 100 to 300 nm thickness may be used. If the film is thin, a disappearance is apt to generate at a dry etching of the ohmic contact film 8 that is described later in detail. On the other hand, if the film is thick, the ON current of TFT decreases.

If a-Si film is used for the semiconductor active film 7, an interface to the a-Si film of the gate insulating film 6 is preferably $SiN_x$ or $SiO_xN_y$ in light of controllability and reliability of a threshold voltage ($V_{th}$) of the TFT, which is a gate voltage in which the TFT becomes conductive. On the other hand if p-Si film is used for the semiconductor active film 7, an interface to the p-Si film of the gate insulating film 6 is preferably $SiO_x$ or $SiO_xN_y$ in light of controllability and reliability of $V_{th}$ of the TFT, which is a gate voltage in which the TFT becomes conductive.

The ohmic contact film 8 is formed over the semiconductor active film 7. As the ohmic contact film 8, an n type a-Si film or an n type p-Si film can be used, which are a-Si or p-Si of approximately 20 to 70 nm thickness doped with a small amount of P.

The source electrode 9 and drain electrode 10 are formed over the ohmic contact film 8 and are connected to the semiconductor active film 7 through the ohmic contact film 8. Further, the source electrode 9 extends to a source terminal (not shown) through the source line 11. The source electrode 9, drain electrode 10 and source line 11 are formed by the same metal film. As the metal film, Al alloy of approximately 100 to 500 nm thickness may be used.

The insulating dielectric 13 is formed over the source electrode 9, drain electrode 10, and source line 11. As the interlayer dielectric 13, the same material as the gate insulating film 6 may be used.

The pixel electrode 17, gate terminal pad 18 and source terminal pad 19 are formed over the interlayer dielectric 13. The pixel electrode 17, gate terminal pad 18 and source terminal pad 19 are formed by the same transparent conductive thin film. The pixel electrode 17 is electrically connected to the drain electrode 10 via the pixel drain contact hole 14. The gate terminal pad 18 is electrically connected to the gate terminal 5 through the gate terminal contact hole 15. The source terminal pad 19 is electrically connected to the source terminal 11 through the source terminal contact hole 16. As the transparent conductive thin film, $In_2O_3$, $SnO_2$, ITO which is a mixture of $In_2O_3$ and $SnO_2$, IZO which is a mixture of $In_2O_3$ and ZnO and ITZO which is a mixture of $In_2O_3$, $SnO_2$ and ZnO or the like may be used. ITO is especially preferable in terms of chemical stability.

A manufacturing method of the TFT active matrix substrate of the first embodiment is described hereinafter in detail. Note that the example described hereinafter is a typical example and it is needless to say that another manufacturing method can be applied without departing from the scope and spirit of the invention.

On the insulating substrate 1 with its surface cleansed, a first Al alloy film for forming the gate electrode 2, auxiliary capacity electrode 3, gate line 4 and gate terminal 5 etc. is formed by the sputtering and vacuum evaporation methods.

Secondly the Al alloy film is patterned by a first photolithography process to form the gate electrode 2, auxiliary capacity electrode 3, gate line 4, and gate terminal 5 etc. The photolithography process is described as follows. After the substrate 1 with the first Al alloy film is cleansed, photoresist is coated and dried. Then the first Al alloy film on the substrate 1 is exposed through a mask pattern with a specified pattern formed thereon and developed, and a resist transcribed with the mask pattern is formed on the first Al alloy film as in photoengraving. Further, after hardening the photoresist by heat treatment, the photoresist is etched to separate the photoresist. If the wettability between the photoresist and the first Al alloy film is not favorable, perform a UV cleansing or a steam coating with HMDS (hexamethyldisilazane) or the like before coating the photoresist.

Further, if the adherence between the photoresist and the first Al alloy film is not favorable causing to separate them, appropriately increase the heat hardening temperature or the time for heat hardening. The etching of the Al alloy film can be a wet etching using an etchant. Further, the etching of the Al alloy film is preferably performed so that a pattern edge to be in a taper shape in light of preventing a short-circuit in bumps with other lines. Here, the taper shape refers that the pattern edge is etched so that the cross section becomes trapezoid. In the same process, it is explained that the gate electrode 2, gate line 4, auxiliary capacity electrode 3 and gate terminal portion 5 are formed. However it is not limited to this and various marks and lines needed to manufacture the TFT active matrix substrate may be formed.

Next, a thin film for forming the gate insulating film 6 formed by $SiN_x$, $SiO_x$, $SiO_xN_y$ or the like, a thin film for forming the semiconductor active film 7 formed by a-Si or p-Si and a thin film for forming the ohmic film 8 formed by an n type a-Si or an n type p-Si are formed continuously by the plasma CVD method. When using the a-Si film as the semiconductor active film 7, by having a small film forming rate around the interface of the gate insulating film 6 and large film forming rate of the upper layer portion, it is possible to obtain a TFT with a large mobility and a small leak current at OFF time in a short film forming time. The patterns of the $SiN_x$, $SiO_xN_y$, a-Si, p-Si, n type a-Si and n type p-Si films can be formed by a dry etching using a known gas ($SiH_4$, $NH_3$, $H_2$, $NO_2$, $PH_3$, $N_2$ and mixed gas).

Next, the semiconductor active film 7 and ohmic contact film 8 are patterned at least in a portion where the TFT portion is formed by a second photolithography process. The gate insulating film 6 remains all over. It is preferable that the semiconductor active film 7 and ohmic contact film 8 are patterned and remained in a portion where the source line 11, gate lien 4 and auxiliary capacity electrode 3 cross over in a planar manner, in addition to the portion where the TFT portion is formed, in light of having an increased withstand voltage in the crossover. Further, it is preferable to remain the semiconductor active film 7 and ohmic contact film 8 of the TFT portion to a lower portion of the source line 11 in a continuous shape because the source electrode 9 will not override the bumps of the semiconductor active film 7 and ohmic contact film 8, thereby a disconnection of the source electrode is hard to be generated in the bumps. The etching of the semiconductor active film 7 and ohmic contact film 8 may be a dry etching by a known gas composition (for example a mixed gas of $SF_6$ and $O_2$ or a mixed gas of $CF_4$ and $O_2$).

Next, an Al alloy film for forming the source electrode 9 and drain electrode 10 is formed by a method such as sputtering. From the Al alloy film, the source line 11 (see FIG. 1), a source terminal (not shown), source electrode 9 and drain electrode 10 are formed by a third photolithography process.

Then, the ohmic contact film 8 is etched. A central part of the ohmic contact film 8 in the TFT portion is removed by this process to expose the semiconductor active film 7. The etching of the ohmic contact film 8 can be a dry etching by a known gas composition (for example a mix gas of $SF_6$ and $O_2$ or a mixed gas of $CF_4$ and $O_2$).

Next, a film for forming the interlayer dielectric 13 that is formed by $SiN_x$, $SiO_x$, $SiO_xN_y$ or the like is formed by the plasma CVD method. The interlayer dielectric 13 is formed from the film by a forth photolithography process. Using a light shielding mask (not shown) with an opening in a portion corresponding to a pixel drain contact hole 14, gate terminal contact hole 15, and source terminal contact hole 16 so as to evenly expose. After the expose process, it is developed using a developer. After that, in a region corresponding the contact holes, openings are formed.

Then, a transparent conductive thin film for forming the pixel electrode 17, gate terminal pad 18 and source terminal pad is formed by the sputtering, vacuum evaporation, coating or the like. To reduce the contact resistance with the Al alloy film, the sputtering method is preferred. The pixel electrode 17, gate terminal pad 18, source terminal pad 19 or the like are formed from the transparent conductive thin film by a fifth photolithography process. The etching of the transparent conductive thin film may be a known wet etching according to a material to be used (for example if the transparent conductive thin film is formed by a crystallized ITO, an aqueous solution mixed with hydrochloric and nitric acids may be used). If the transparent conductive thin film is ITO, it may be dry etched by a known gas composition (for example HI and HBr).

The TFT active matrix substrate manufactured in this way is bonded with an opposing substrate (not shown) having a color filter and an opposing electrode via a spacer, and a liquid crystal is filled in between. A liquid crystal display is manufactured by mounting a liquid crystal panel holding this liquid crystal layer to a backlight portion.

EXAMPLE 1

A specific example of the first embodiment is described hereinafter in detail. As a first metal film (the gate electrode 2, auxiliary capacity electrode 3, gate line 4 and gate terminal 5) and a second metal film (the drain electrode 9 and source electrode 10) of the first embodiment, Al-3.0 mol % Ni alloy film, which is a pure Al added with 3.0 mol % Ni is used. The ITO film is used as the transparent conductive film (the pixel electrode 17, gate terminal pad 18 and source terminal pad 19). The composition of the Al alloy film is measured by dissolving the Al alloy film formed over an insulating substrate into for example an acid solution such as aqua regia using the ICP (Inductively Coupled Plasma) emission spectral analysis. As an ICP emission spectral analyzer, SPS-1200AR manufactured by Seiko Instruments Inc. is used.

A contact resistance value of a connector between the pixel electrode 17 and drain electrode 10 in the pixel drain contact hole 14 is approximately 10Ω for an area of contact hole opening 50 $\mu m^2$. A contact resistance value of the gate terminal pad 18 and the gate terminal 5 in the gate terminal contact hole 15 and a contact resistance value of a connector between the source terminal pad 19 and the source terminal 11 are also approximately 10Ω for an area of contact hole opening 50 $\mu m^2$.

A contact resistance value when using the conventional pure Al film for the second metal film is approximately 100 MΩ for an area of contact hole opening 50 $\mu m^2$. Specifically, the contact resistance value of the first embodiment is $1/10^7$ of the conventional pure Al film which is extremely favorable value.

Next, a reason why the contact resistance value is extremely low in the first embodiment has been investigated. An assay sample that laminates an Al-3.0 mol % Ni alloy film of approximately 50 nm thickness and an ITO film of approximately 20 nm thickness laminated in this order is manufactured over a substrate by the sputtering method. Hereinafter for the convenience of the explanation, a thin film formed by an upper layer ITO layer and a lower layer Al—Ni film is referred to as ITO/Al—Ni.

A depth profile is examined for the assay sample using the X-ray photoelectron spectroscopy. As for the X-ray photoelectron analyzer, Quantum2000 manufactured by ULVAC-PHI, Inc. is used. Conditions of the analysis are that a source of radiation Al—K alpha ray, a beam diameter 100 μm, and an output 20 kV-10 W.

Figure 3:
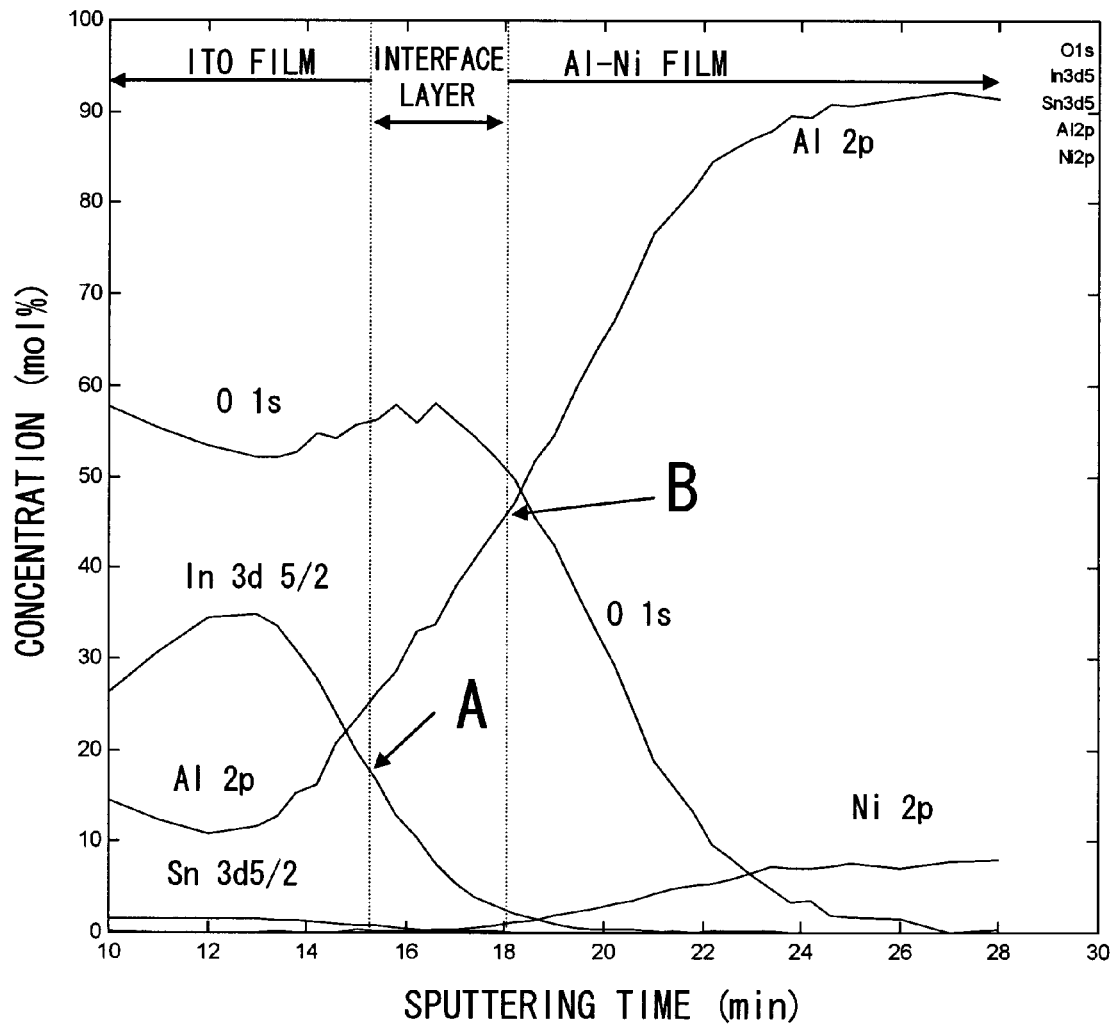
FIG. 3 is a view showing a depth profile by a X-ray photoelectron spectroscopy for ITO/Al—Ni alloy laminated film according to the first embodiment of the present invention.

FIG. 3 is a view showing depth profile of Al (2p orbital component), O (1s orbital component), In (3d orbital component), Sn(3d orbital component) and Ni(2p orbital component) in a near interface layer of the assay sample by a X-ray photoelectron spectroscopy. The horizontal axis in FIG. 3 indicates a sputtering time, while the vertical axis indicates mol % (atomic %) concentration of the above element. In the X-ray photoelectron analysis of this embodiment, a sample is etched by a sputtering and a depth profile is obtained by analyzing its surface. Accordingly the sputtering time indicated by the horizontal axis corresponds to the depth from the ITO surface, which is an upper layer.

As shown in FIG. 3, in a region in which the sputtering time is short, many In, O and Sn which are constituent elements of the upper layer ITO film, and the longer the sputtering time, the more Al and Ni which are constituent elements of the lower layer Al—Ni film.

A region between a depth that is a half of the maximum concentration of In (indicated by A in FIG. 3) and a depth that is a half of the maximum concentration of Al (indicated by B in FIG. 3) is defined as an interface layer. Further, a region upper layer than A in FIG. 3 is defined as an ITO film. A region lower layer than B in FIG. 3 is defined as an Al—Ni film. Furthermore, a region to the side of the ITO film is defined as a near ITO interface layer, while a region to the side of the Al—Ni film is defined as a near Al—Ni interface layer.

From FIG. 3, it can be seen that O concentration is increasing in interface layer. This indicates that an Oxide Al (AlO$_x$) exists in the interface layer. As the oxide Al is an insulator, so if the oxide Al exists over the interface, the electric conductivity is supposed to be blocked. However practically as described in the foregoing, the resistance value of the connector between the pixel electrode 17 and drain electrode 10 in the pixel drain contact hole 14 is that an extremely low contact resistance value as compared to the conventional example.

Figure 4:
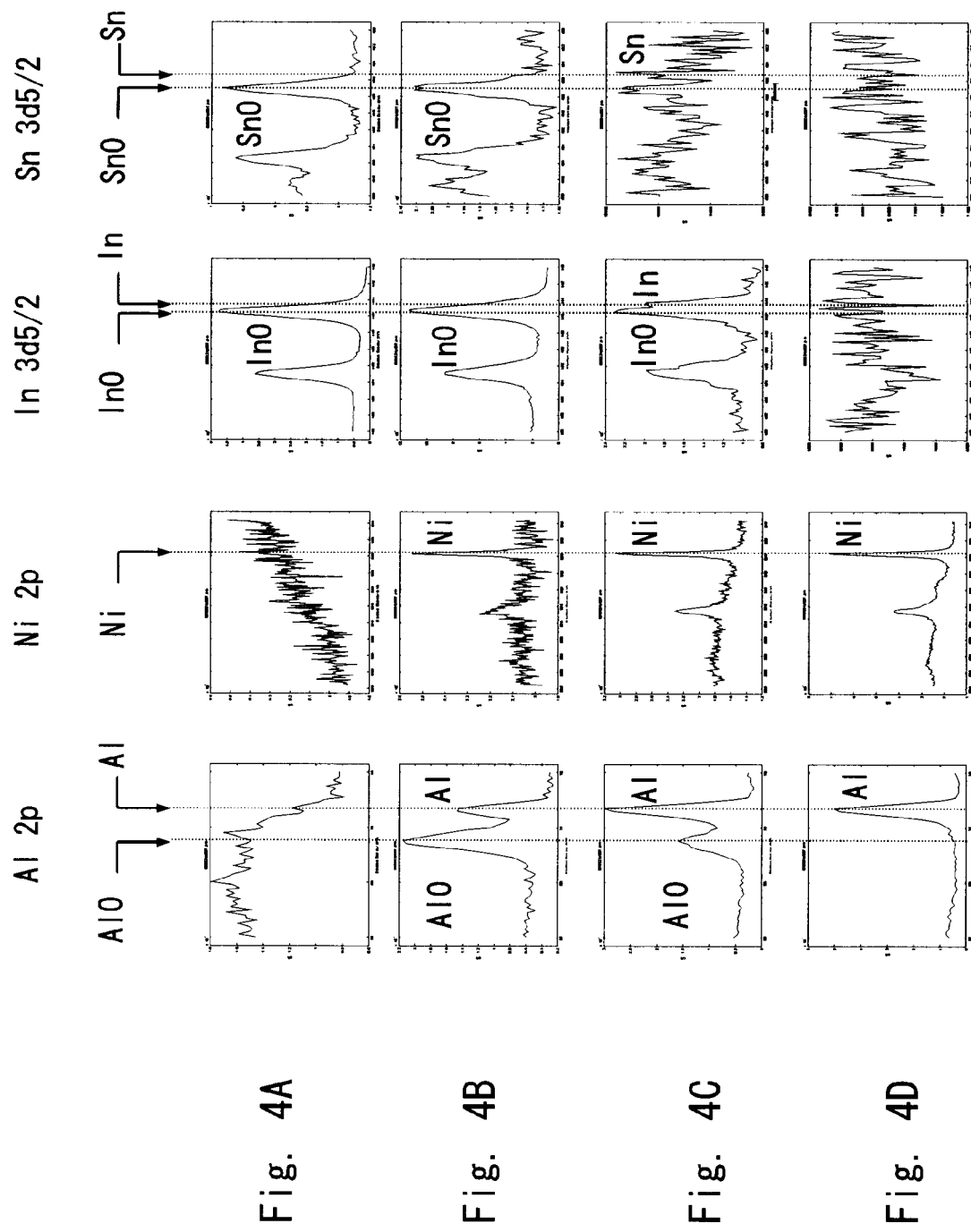
FIGS. 4A to 4D are views showing a X-ray photoelectron spectrum of an interface of the ITO/Al—Ni alloy laminated film according to the first embodiment.

Therefore, connection condition of Al (2p orbital component), Ni (2p orbital component), In (3d orbital component) and Sn (3d orbital component) are examined in 4 points of a depth direction (the ITO, near ITO interface layer, near Al—Ni interface layer and Al—Ni films) using a X-ray photoelectron spectrum. The results are shown in FIGS. 4A to 4D. FIG. 4A shows a connection condition of each of the above elements in the ITO film, FIG. 4B shows it in the near ITO interface layer, FIG. 4C shows it in the near Al—Ni interface layer and FIG. 4D shows it in the Al—Ni film.

In the ITO film, only oxide In (InO$_x$) and oxide Sn (SnO$_x$) were detected (see FIG. 4A). An oxide Al (AlO$_x$), Al, Ni, oxide In (InO$_x$) and oxide Sn (SnO$_x$) are detected in the near ITO interface layer. An oxide Al (AlO$_x$) Al, Ni, Oxide In(InO$_x$), In, Oxide Sn(SnO$_x$) and Sn are detected in the near Al—Ni interface layer (see FIG. 4C). Only Al and Ni are detected in Al—Ni film (see FIG. 4D). In FIGS. 4A to 4D, the oxide Al, oxide In and oxide Sn are respectively referred to as AlO, InO and SnO for convenience.

Figure 5:
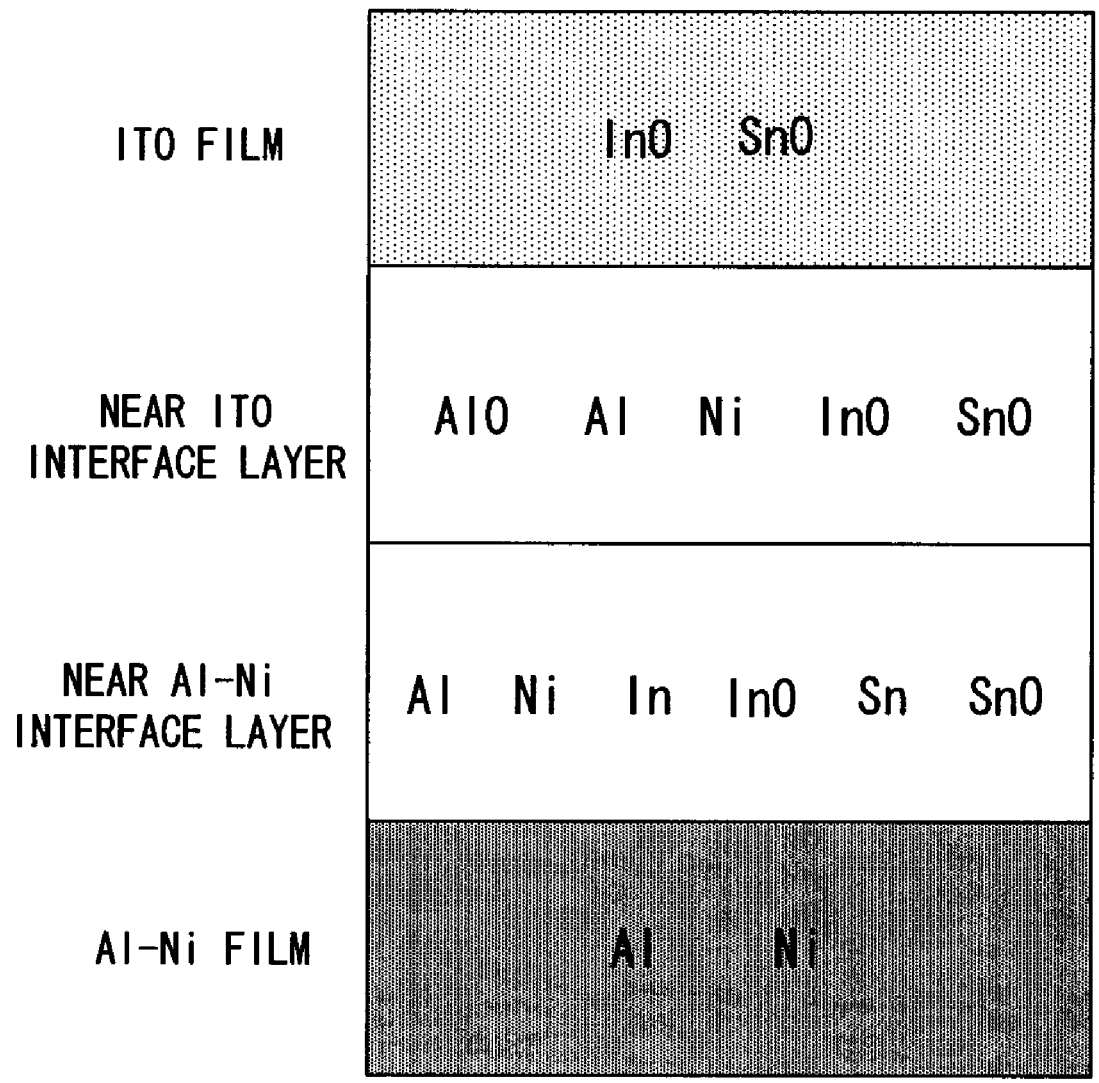
FIG. 5 is a view schematically showing an interface structure of ITO/Al—Ni alloy laminated film according to the first embodiment.

FIG. 5 is a view schematically showing the structure of ITO film, near ITO interface layer, near Al—Ni interface layer and Al—Ni films. As shown in FIG. 5, when the Al—Ni, which is Al added with Ni, and ITO films contact, conductive Al, Ni, oxide In, In, oxide Sn and Sn exist in addition to the oxide Al which is an insulator. Specifically, the oxide Al does not exist all over the interface, and in the portions where the oxide Al does not exist, a conductive path is formed between the ITO and Al—Ni films by the above conductive material existing continuously in the depth direction of the interface layer, thereby obtaining a favorable electric contact characteristic.

Second Embodiment

An embodiment different from the TFT active matrix substrate of the first embodiment is described hereinafter. In the description which follows, like parts in the first embodiment are marked throughout the specification and drawings with the same reference numerals, respectively.

Figure 6:
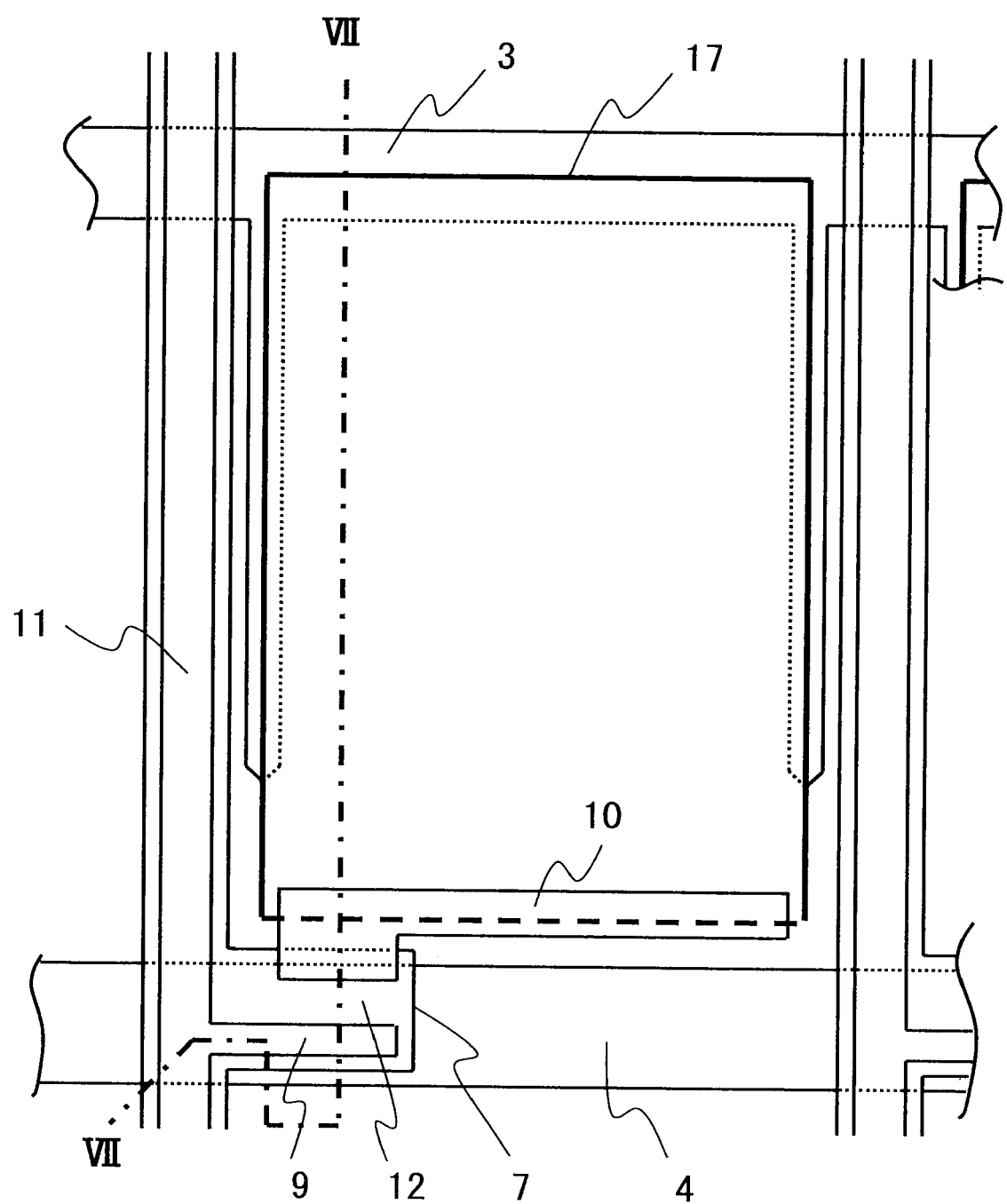
FIG. 6 is a plan view showing a TFT active matrix substrate according to a second embodiment.
Figure 7:
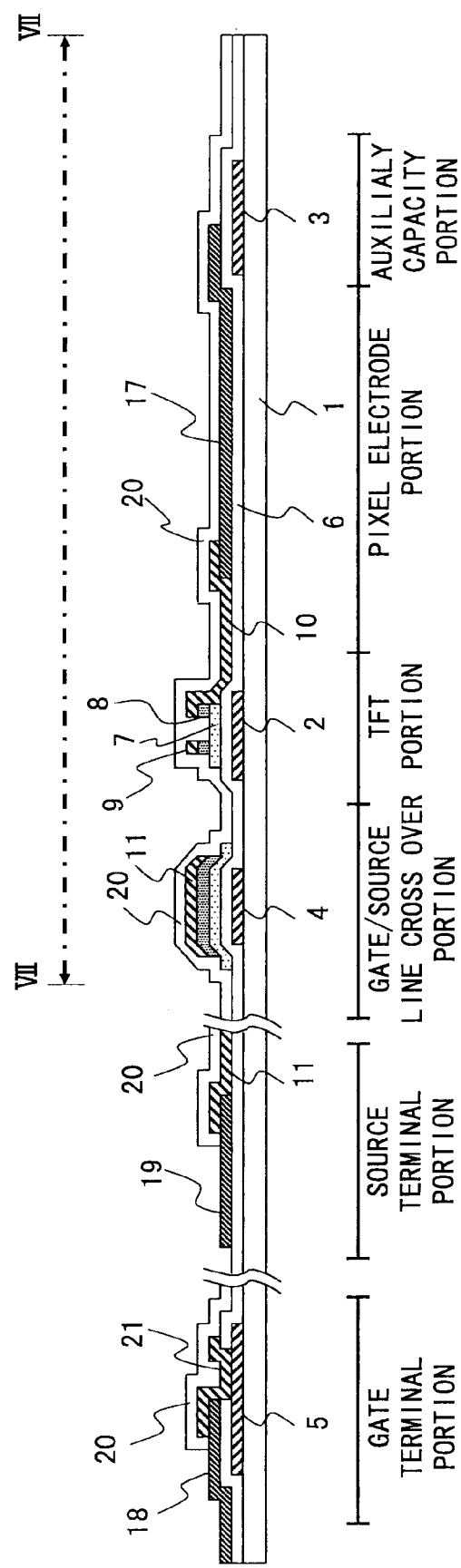
FIG. 7 is a cross-sectional diagram showing a TFT active matrix substrate according to the second embodiment.

FIG. 6 is a plan view showing a pixel of an image display region in a TFT active matrix substrate of a second embodiment. FIG. 7 is a cross-sectional diagram taken along the line VII-VII of FIG. 6 and also a cross-sectional diagram showing a signal input terminal portion (not shown in FIG. 6) that is formed outside the image display region of the TFT active matrix substrate. The basic configuration of the TFT active matrix substrate of the second embodiment is the same as the TFT active matrix substrate of the first embodiment except the differences described hereinafter.

In the first embodiment, the first metal film (the gate terminal 5) below the transparent conductive film (the pixel electrode 17, gate terminal pad 18 and source terminal pad 19) and the second metal film (the drain electrode 19 and source terminal 11) are electrically connected via the contact hole (the pixel drain contact hole 14, gate terminal contact hole 15 and source terminal contact hole 16). On the other hand in the second embodiment, the first metal layer (the drain electrode 10 and source terminal 11a) above the transparent conductive film is electrically connected without involving the contact hole. Specifically, in the first and second embodiment, a hierarchy of an electric connection of the second metal layer and transparent conductive film is reversed to each other. Therefore in the first embodiment, the transparent conductive film is formed above the laminated layer of the second metal layer and interlayer dielectric 13, however the second embodiment is different in that the transparent conductive film is formed below the second metal film. Another difference is that the interlayer dielectric 13 is not formed and a insulating passivation protection film 20 is formed above the transparent conductive film and second metal film. Another difference is that the gate terminal 5 and the gate terminal pad 18 are electrically connected by the connection film 21 formed by the second metal film.

As shown in FIG. 7, the TFT active matrix substrate of the second embodiment has a contact structure in which the drain electrode 10 is electrically connected with the pixel electrode 17 which is formed by the lower layer transparent conductive film therebelow, the connection film 21 is electrically connected with the gate terminal pad 18 therebelow which is formed by the transparent conductive film, and the source terminal 11 is electrically connected with the source terminal pad 19 which is formed by the transparent conductive film therebelow.

EXAMPLE 2

A specific example of the second embodiment is described hereinafter in detail. As a first metal film (the gate electrode 2, auxiliary capacity electrode 3, gate line 4 and gate terminal 5) and a second metal film (the drain electrode 9 and source electrode 10) of an example 2, Al-3.0 mol % Ni alloy which is a pure Al added with 3.0 mol % Ni is used. For the transparent conductive film (the pixel electrode 17, gate terminal pad 18 and source terminal pad 19), the ITO film is used.

A resistance value of the connector between the pixel electrode 17 and drain electrode 10, a resistance value of the connector between the gate terminal pad 18 and the connection film 21, and a resistance value of the connector between the source terminal pad 19 and source terminal 11a are approximately 10Ω for 50 μm². The value is $\frac{1}{10}^7$ of the conventional pure Al film which is extremely favorable value.

An assay sample laminated with an ITO film of approximately 50 nm thickness and an Al-3.0 mol % Ni alloy film of approximately 1 nm thickness in this order is manufactured over a substrate using the sputtering method to closely examine the surface structure of the Al—Ni and ITO films as with the example 1. A thin film formed by an upper layer of Al—Ni film and a lower layer of ITO film is referred to as Al—Ni/ITO hereinafter.

Figure 8:
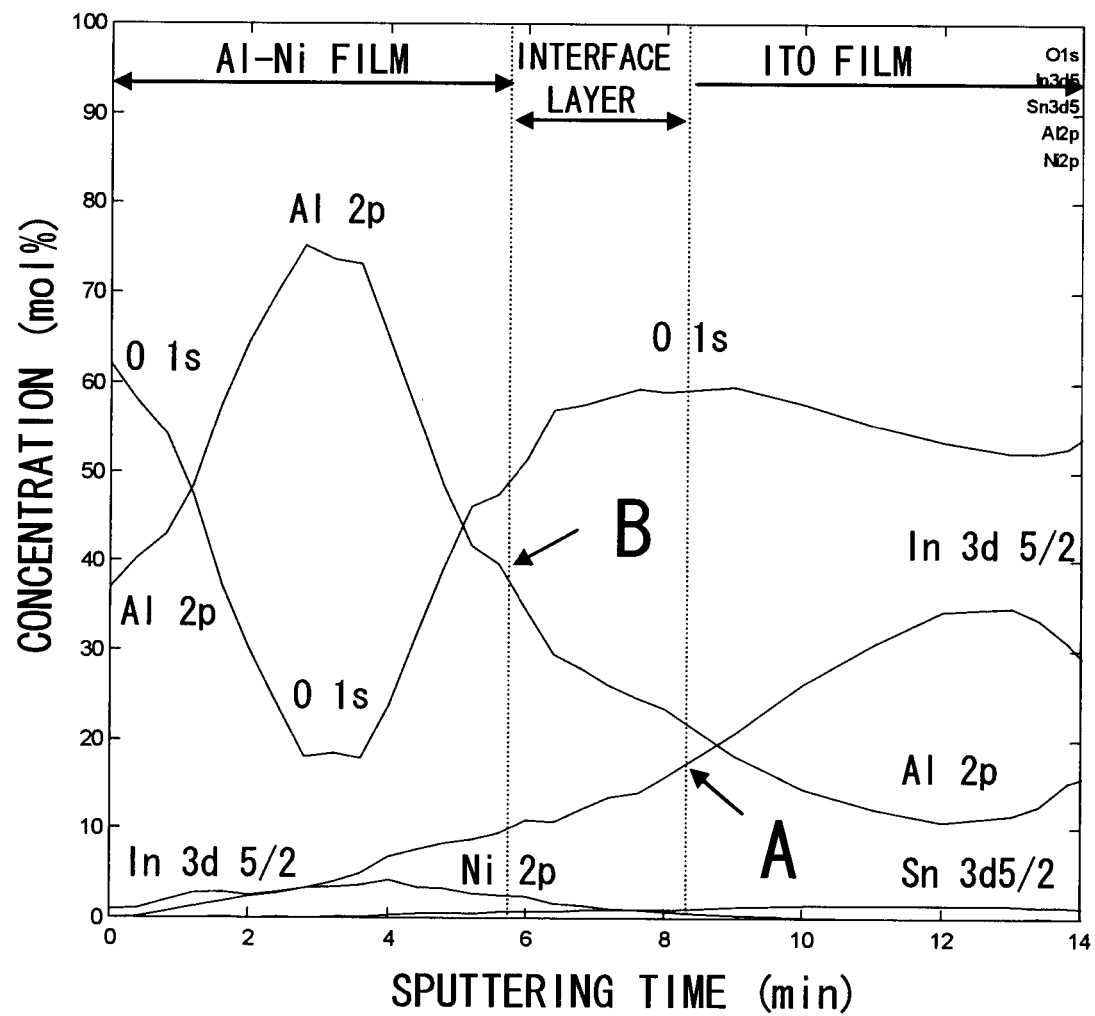
FIG. 8 is a view showing a depth profile by a X-ray photoelectron spectroscopy for Al—Ni alloy/ITO laminated film according to the second embodiment of the present invention.

FIG. 8 is a view showing depth profile of Al (2p orbital component), O (1s orbital component), In (3d orbital component), Sn (3d orbital component) and Ni (2p orbital component) in a near interface layer of the assay sample Al—Ni/ITO by a X-ray photoelectron spectroscopy. The conditions for the analysis are the same as in example 1.

As shown in FIG. 8, in a region in which the sputtering time is short, many Al and Ni which are constituent elements of the upper layer Al—Ni film, and the longer the sputtering time, the more In, O and Sn which are constituent elements of the lower layer ITO film. The definitions of the interface layer, Al—Ni and ITO film are same as the first embodiment.

Figure 9:
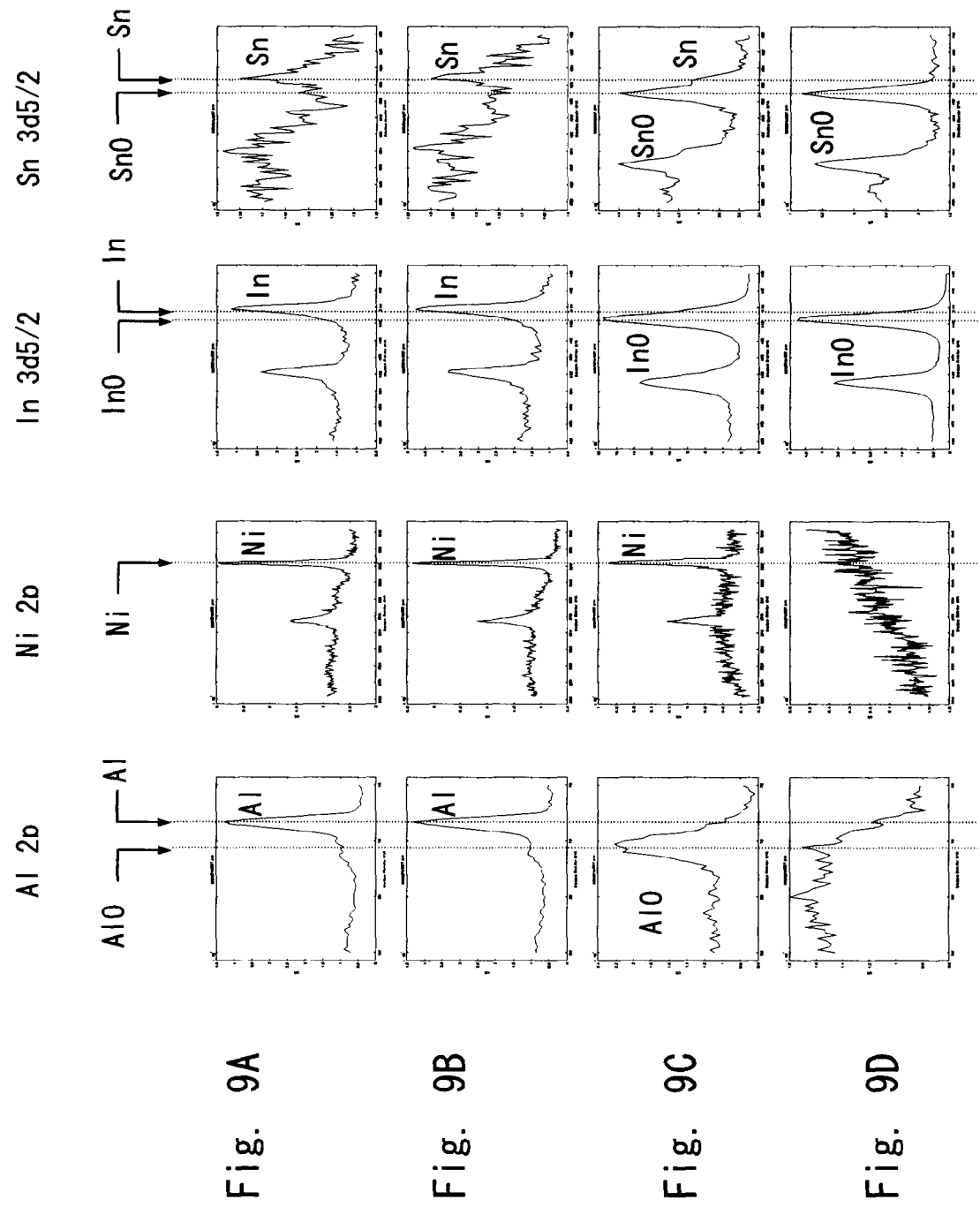
FIGS. 9A to 9D are views showing a X-ray photoelectron spectrum of an interface of the Al—Ni alloy/ITO laminated film according to the second embodiment.

From FIG. 8, it can be seen that 0 concentration is increasing in interface layer. This indicates that an oxide Al layer ($AlO_x$) exists in the interface layer that exists between the ITO and Al—Ni films. Therefore, connection condition of Al (2p orbital component), Ni (2p orbital component), In (3d orbital component) and Sn (3d orbital component) are examined in 4 points of a depth direction (the Al—Ni, near Al—Ni interface layer, near ITO interface layer and ITO films) using a X-ray photoelectron spectrum. The results are shown in FIGS. 9A to 9D. FIG. 9A shows a connection condition of each of the above elements in the Al—Ni film, FIG. 9B shows it in the near Al—Ni interface layer, FIG. 9C shows it in the near ITO interface layer and FIG. 9D shows it in the ITO film.

In the Al—Ni film, Sn and In are detected in addition to Al and Ni (see FIG. 9A). In the near Al—Ni interface layer, Al, Ni, In and Sn are detected (see FIG. 9B). In the near ITO interface layer, oxide Al ($AlO_x$), Ni, oxide In ($InO_x$), oxide Sn ($SnO_x$) and Sn are detected (see FIG. 9C). In the ITO film, only oxide In ($InO_x$) and oxide Sn ($SnO_x$) are detected (see FIG. 9D). In FIGS. 9A to 9D as well, the oxide Al, oxide In and oxide Sn are respectively indicated by AlO, InO and SnO.

Figure 10:
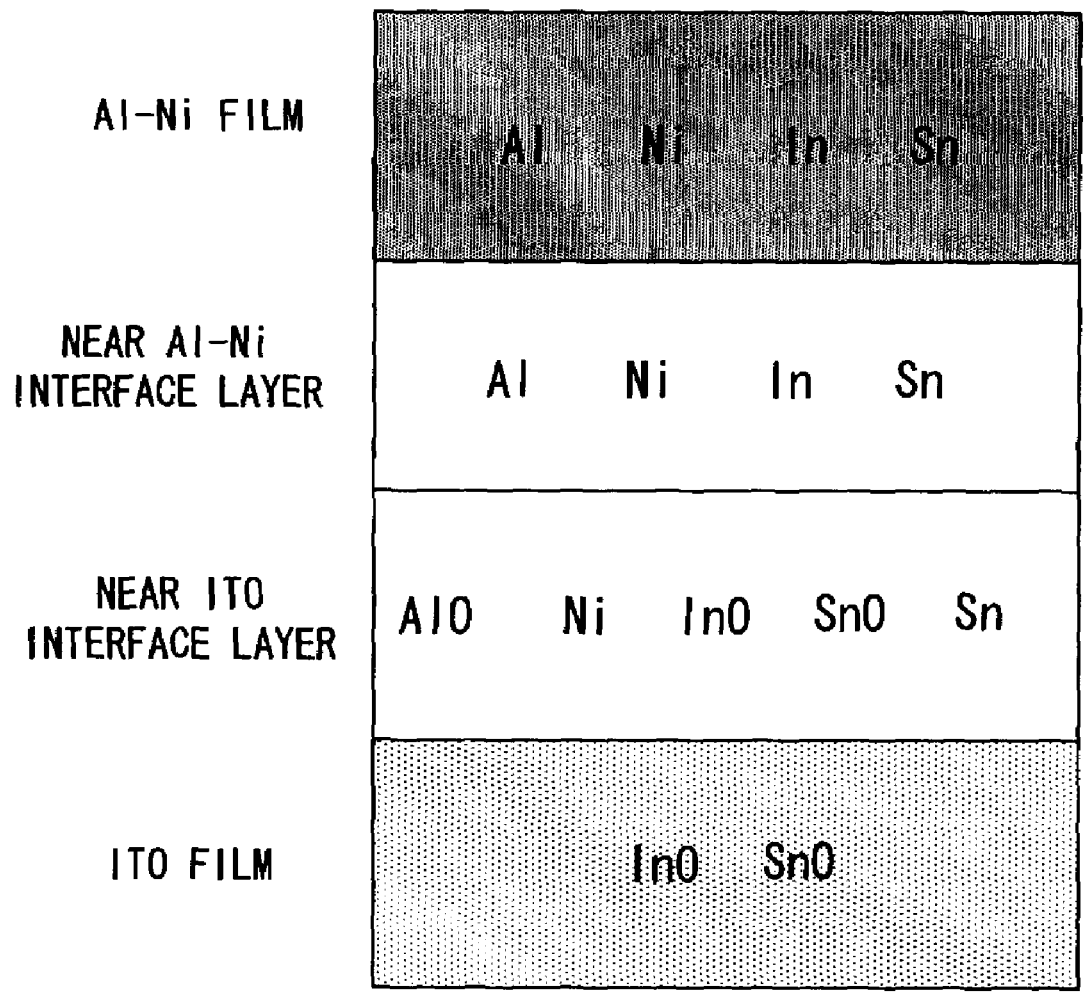
FIG. 10 is a view schematically showing an interface structure of Al—Ni alloy/ITO laminated film according to the second embodiment.

FIG. 10 is a view schematically showing structures of the Al—Ni film, near Al—Ni interface layer, near ITO interface layer and ITO film, from the result shown in FIGS. 9A to 9D. As shown in FIG. 10, when the Al—Ni film, which is an Al added with Ni, contacts the ITO film, conductive Al, Ni, oxide In, In, Oxide Sn and Sn exists in addition to the oxide Al, which is an insulator. Specifically, the oxide Al does not exist all over the surface, a conductive path is formed between the ITO and Al—Ni films by the above conductive material existing continuously in the depth direction of the interface layer, thereby obtaining a favorable electric contact characteristic.

In the first and second embodiments, an ITO film is used as a preferred embodiment of the transparent conductive film. However an IZO or an ITZO film may be used instead of that. In either case, the resistance value of the connector is approximately 100Ω for a contact hole opening area 50 μm², obtaining a favorable value almost the same as for the ITO film. If using the IZO film, In and Ni are confirmed to exist in the interface layer. If using the ITZO film, In, Sn and Ni are confirmed to exist in the interface layer.

In the first and second embodiments, as a preferred embodiment of the first and/or second metal film, Al—Ni film which is a pure Al added with 3 mol % Ni is used. However an amount of addition of Ni is not limited to this. If the amount of Ni addition is more or equal to 0.5 mol %, the contact resistance value can be reduced to approximately less than or equal to 1000Ω. The higher the Ni concentration is, the more the specific resistance value of Al—Ni alloy becomes. Thus the Ni concentration is preferably less or equal to 10 mol %. A specific resistance value of Al-10 mol % Ni alloy is approximately 0.25 μΩm. This value is lower than the specific resistance value of pure Cr and pure Mo that are generally used for the line material.

Furthermore in the first and second embodiments, as the first and/or second metal layer, Al—Ni film is formed to be one layer. However it may be a laminated layer structure in which Al—Ni film is formed only in the interface portion with the transparent conductive film, and for other portion, Al and Cu that have lower specific resistance or a film formed by an alloy of Al and Cu may be formed. In such case, the thickness of the Al—Ni film is preferably be more or equal to 5 nm. With the thickness less or equal to 5 nm, the deposition is likely to be imperfect, making it hard to obtain an enough contact resistance. On the other hand, the thickness of the metal film to be the main body can be specified according to a line resistance desired for the device. By having a metal film with lower specific resistance than the Al—Ni film as the main of the lines, it is possible to have a lower line resistance as compared to Al—Ni single layer structure as long as film thickness is the same.

The additional element to Al is not limited to Ni but may be 8 group elements (Fe, Co, Ru, Rh, Pd and Pt etc.) which are the same group as Ni. In such case also, the contact resistance value with the ITO film can be lowered. The additional element is not limited to one kind and may be 2 or more kinds. However when adding Ru, Rh, Pd and Pt which have large atomic numbers, the chemical stability deteriorates. Specifically processes for an alkali developer for example in a process of patterning the photoresist requires extra caution because a resistant to the alkali drug solution deteriorates. Accordingly with a consideration over a high reliability for the process, the additional element to Al is particularly preferable if it is Fe, Co or Ni.

For the additional element to Al, an element of at least one kind selected from N, C and Si may be added. By adding the above elements, the oxide Al is suppressed to be formed, thereby accomplishing a more favorable electric contact characteristic. An amount of addition of these elements is preferably 5 to 15 mol % in total. Further, it is more effective when adding N, C and Si in addition to the above 8 group elements. In such case as well, an amount of addition is preferably 5 to 15 mol % in total. In either case, a favorable electric contact characteristic cannot be obtained with less than 5 mol %, and with more than 15 mol %, a specific resistance value exceeds 0.25 μΩm, thereby losing a superiority to the conventional high-melting point metal. Note that the favorable electric contact characteristic is less than 10 times contact resistance of the ITO as compared to the conventional high-melting point metal. Specifically, if a contact resistance of the conventional high-melting point metal and ITO is approximately 100 to 200Ω for an opening area of 50 μm$^2$, it is favorable to have approximately 1000 to 2000Ω.

As an additional element to Al, one or more kinds of element selected from Cu, Y, rare earth element La, Ce, Nd, Sm, Gd, Tb and Dy may be added in addition to the above 8 group elements. Adding these elements improves heat and corrosion resistance of Al alloy, thus it is preferable to add these elements to improve reliability of lines.

Although the first to fourth embodiment are TFT active matrix substrates for liquid crystal displays, the present invention may be applied to an Electro Luminescence (EL) display apparatus or the like. Further, the present invention is not limited to a display device but may be applied to other semiconductor device having an electric connector for a metal film and a transparent conductive film.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor device comprising:
   a semiconductor layer;
   an aluminum alloy film electrically connected to the semiconductor layer;
   a transparent electrode layer directly contacting the aluminum alloy film at least over an insulting substrate; and
   an interface region between the aluminum alloy film and the transparent electrode layer,
   wherein the aluminum alloy film comprises:
   one or more group 8b metals selected from the group consisting of iron, cobalt and nickel, wherein the one or more group 8b metals are present in a total amount of 0.5-10mole %;
   nitrogen or a mixture of nitrogen and one or more elements selected from the group consisting of carbon, silicon, and a combination thereof, wherein said nitrogen or said mixture is present in an amount of 5-15 mole %; and
   a remaining amount predominantly comprising aluminum, and
   wherein the interface region comprises:
   one or more conductive metal oxides, which are included in the transparent electrode layer; and
   one or more non-oxidized metal elements, which are included in the aluminum alloy film or the transparent electrode layer.

2. The semiconductor device according to claim 1, wherein the aluminum alloy film comprises iron as the one or more group 8b metals in a total amount of 0.5-10 mole %.

3. The semiconductor device according to claim 1, wherein the aluminum alloy film comprises cobalt as the one or more group 8b metals in a total amount of 0.5-10 mole %.

4. The semiconductor device according to claim 1, wherein the aluminum alloy film comprises nickel as the one or more group 8b metals in a total amount of 0.5-10 mole %.

5. The semiconductor device according to claim 1, wherein the aluminum alloy film comprises nickel and at least one of iron and cobalt as the one or more group 8b metals in a total amount of 0.5-10 mole %.

6. The semiconductor device according to claim 1, wherein the aluminum alloy film comprises iron, cobalt and nickel as the one or more group 8b metals in a total amount of 0.5-10 mole %.

7. The semiconductor device according to claim 1, wherein the aluminum alloy film comprises nitrogen in a total amount of 5-15 mole %.

8. The semiconductor device according to claim 1, wherein the aluminum alloy film comprises a mixture of nitrogen and carbon in a total amount of 5-15 mole %.

9. The semiconductor device according to claim 1, wherein the aluminum alloy film comprises a mixture of nitrogen and silicon in a total amount of 5-15 mole %.

10. The semiconductor device according to claim 1, wherein the aluminum alloy film comprises one or more additional elements selected from the group consisting of yttrium, lanthanum, cerium, neodymium, samarium, gadolinium, terbium and dysprosium, wherein the one or more additional elements are present in a total amount of 5-15 mole %.

11. The semiconductor device according to claim 1, wherein the transparent electrode layer comprises indium oxide ($In_2O_3$).

12. The semiconductor device according to claim 1, wherein the transparent electrode layer comprises tin oxide ($SnO_2$).

13. The semiconductor device according to claim 1, wherein the transparent electrode layer comprises indium tin oxide (ITO), which is a mixture of $In_2O_3$ and $SnO_2$.

14. The semiconductor device according to claim 1, wherein the transparent electrode layer comprises indium zinc oxide (IZO), which is a mixture of $In_2O_3$ and ZnO.

15. The semiconductor device according to claim 1, wherein the transparent electrode layer comprises indium tin zinc oxide (ITZO), which is a mixture of $In_2O_3$, $SnO_2$ and ZnO.

16. An active matrix display device comprising the semiconductor device according to claim 1.

17. A liquid crystal display comprising the active matrix display device according to claim 16.

18. A semiconductor device comprising:
    a semiconductor layer;
    an aluminum alloy film electrically connected to the semiconductor layer;
    a transparent electrode layer directly contacting the aluminum alloy film at least over an insulting substrate; and
    an interface region between the aluminum alloy film and the transparent electrode layer,
    wherein the aluminum alloy film comprises:
    one or more group 8b metals selected from the group consisting of iron, cobalt and nickel, wherein the one or more group 8b metals are present in a total amount of 0.5-10 mole %;
    nitrogen or a mixture of nitrogen and one or more elements selected from the group consisting of carbon, silicon, and a combination thereof, wherein said nitrogen or said mixture is present in an amount of 5-15 mole %; and
    a remaining amount predominantly comprising aluminum, and
    wherein the interface region comprises:
    one or more conductive metal oxides, which are included in the transparent electrode layer; and one or more non-oxidized metal elements, which are included in the aluminum alloy film or the transparent electrode layer, so that a conductive path is formed between the transparent electrode layer and the aluminum alloy film.

19. The semiconductor device according to claim 1, wherein the aluminum alloy film comprises a mixture of nitrogen, carbon and silicon in a total amount of 5-15 mole %.

* * * * *